(12) United States Patent
Tripsas et al.

(10) Patent No.: US 7,696,017 B1
(45) Date of Patent: Apr. 13, 2010

(54) MEMORY DEVICE WITH A SELECTION ELEMENT AND A CONTROL LINE IN A SUBSTANTIALLY SIMILAR LAYER

(75) Inventors: Nicholas H. Tripsas, San Jose, CA (US); Suzette Paugrle, Cupertino, CA (US)

(73) Assignee: Spansion LLC, Sunnyvale, CA (US)

( * ) Notice: Subject to any disclaimer, the term of this patent is extended or adjusted under 35 U.S.C. 154(b) by 113 days.

(21) Appl. No.: 12/141,180

(22) Filed: Jun. 18, 2008

Related U.S. Application Data

(62) Division of application No. 11/001,519, filed on Dec. 1, 2004, now Pat. No. 7,391,064.

(51) Int. Cl.
*H01L 21/82* (2006.01)
(52) U.S. Cl. ........................................ 438/128; 438/133
(58) Field of Classification Search .............. 438/128, 438/133
See application file for complete search history.

(56) References Cited

U.S. PATENT DOCUMENTS 6,369,431 B1  4/2002  Gonzalez et al.

*Primary Examiner*—Douglas M Menz
(74) *Attorney, Agent, or Firm*—Turocy & Watson, LLP

(57) ABSTRACT

The invention facilitates manufacture of semiconductor memory components by reducing the number of layers required to implement a semiconductor memory device. The invention provides for a selection element to be formed in the same layer as one of the control lines (e.g. one of the wordline and bitline). In one embodiment of the invention, a diode is implemented as the selection element within the same layer as one of the control lines. Production of the selection element within the same layer as one of the wordline and bitline reduces problems associated with vertical stacking, increases device yield and reduces related production costs. The invention also provides an efficient method of producing memory devices with the selection element in the same layer as one of the control lines.

20 Claims, 15 Drawing Sheets

MEMORY DEVICE WITH A SELECTION ELEMENT AND A CONTROL LINE IN A SUBSTANTIALLY SIMILAR LAYER

CROSS REFERENCE TO RELATED APPLICATIONS

This application is a divisional of U.S. patent application Ser. No. 11/001,519, filed on Dec. 1, 2004, entitled "MEMORY DEVICE WITH A SELECTION ELEMENT AND A CONTROL LINE IN A SUBSTANTIALLY SIMILAR LAYER", the entirety of which is incorporated herein by reference.

FIELD OF INVENTION

The subject invention relates generally to semiconductor devices and, in particular, to a semiconductor memory device with a selection element and a control line in a substantially similar layer of the semiconductor memory device.

BACKGROUND OF THE INVENTION

The reduction in size of semiconductor components and increased usage of semiconductor processors has lead to an explosion of new electronic devices. Most, if not all, of these electronic devices require some amount of memory in order to function. The proliferation of such devices has significantly increased demand for memory that is efficient in size as well as power consumption. Smaller sized semiconductor components and memories have made numerous hand held electronic devices feasible. Examples of hand-held devices include cell phones, personal radios, walkie-talkies, personal data assistants, palm pilots, pagers, notebook computers, remote controls, voice recorders, audio recorders, video recorders, radios, small televisions, web viewers, cameras, and the like. Although some electronic devices require only relatively small amounts of memory, many newer electronic devices require an increasing amount of memory. For example, digital cameras, digital audio players, personal digital assistants, and the like generally seek to employ large capacity memory components, such as, for example, flash memory cards, smart media cards, compact flash cards, pen drives and/or other similar devices.

Memory components are typically divided into volatile memory and non-volatile memory. Volatile memory components generally do not retain information stored or programmed within them when power is removed from the component. Such memories typically require periodic refresh cycles to maintain their information. Volatile memory components include most forms of random access memory (RAM). RAM is available in many forms such as, for example synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). In contrast, non-volatile memory components retain their information even when power is removed. Examples of non-volatile memory components include; ROM, programmable read only memory (PROM), erasable programmable read only memory (EPROM), electrically erasable programmable read only memory (EEPROM), flash EEPROM, and the like. Comparatively, volatile memory components generally provide faster operation at lower cost than non-volatile memory components.

In many instances, such memory components comprise at least one array of memory elements and associated semiconductor control elements to support various functions like the ability of being repeatedly "written", "erased", and/or "read". A memory element with supporting semiconductor elements can be referred to as a memory device, and a memory component comprises a plurality of such memory devices. Individual memory elements in a memory component can be "written" with information, can be "erased", or can be "read". Individual memory elements are generally programmed or written to an "on" state (e.g., a logic "1") or erased to an "off" state (e.g., a logic "0"). When a memory component is "read", the information (e.g. the "on" state or "off" state) is retrieved in such a manner that the state of the individual memory elements remains unaltered. Typically, a memory component is addressed in order to be written, erased, or read. Control lines generally referred to a wordlines and bitlines or row address select (RAS) and column address select (CAS) lines control access to specific memory devices for purposes of writing, erasing or reading a specific memory element. Memory components are often fabricated with inorganic solid state technology, such as, crystalline silicon devices. A common semiconductor device employed in memory elements is the metal oxide semiconductor field effect transistor (MOSFET).

Memory component developers and manufacturers are constantly striving to increase storage capacity and to reduce cost of manufacture for memory components. To increase device densities, manufacturers typically focus on scaling down semiconductor device dimensions (e.g. at sub-micron levels). In order to accomplish such densities, smaller feature sizes and more precise feature shapes are often required. This may include the width and spacing of interconnecting lines, spacing and diameter of contact holes, and the surface geometry, such as corners and edges, of various features. A post-age-stamp-sized piece of silicon may contain tens of millions of transistors, each transistor as small as a few hundred nanometers. A resulting memory component will often comprise a multitude of individual semiconductor layers requiring numerous fabrication steps to complete. In general, more complex devices require more individual layers to implement. With the size of semiconductor features decreasing and number of layers increasing, sensitivity to alignment tolerances makes fabrication markedly more difficult. As the number of layers required to produce a semiconductor device increases, manufacturing defects generally increase and, therefore, the yield decreases.

SUMMARY OF THE INVENTION

The following is a summary of the invention in order to provide a basic understanding of some aspects of the invention. This summary is not intended to identify key/critical elements of the invention or to delineate the scope of the invention. Its sole purpose is to present some concepts of the invention in a simplified form as a prelude to the more detailed description that is presented later.

The subject invention provides semiconductor memory devices and methods for forming such devices, wherein a selection element of a device is formed in a substantially similar layer as one or more control lines (e.g. wordlines and bitlines). In accordance with one aspect of the invention, producing such memory device requires fewer layers to implement than conventional techniques, thereby reducing complexity of vertical stacking. In addition, formation of the selection element within the substantially similar layer as a wordline or bitline can mitigate vertical stacking issues, increase device yield and reduce related production costs. It is to be appreciated that in one instance a diode can be utilized as the selection element.

The invention also facilitates manufacture of densely populated semiconductor memory components through reducing the number of layers required to implement semiconductor memory devices within memory components. In such components, control voltages can be applied to wordlines and/or bitlines to facilitate writing, erasing, and/or reading a single memory device within an array of semiconductor memory devices. The unique characteristics of diodes allow them to function as selection elements and facilitate application of control voltages to accomplish such writing, erasing, and/or reading. In this manner, each memory device within an array of memory devices can be programmed with similar or disparate data or states.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
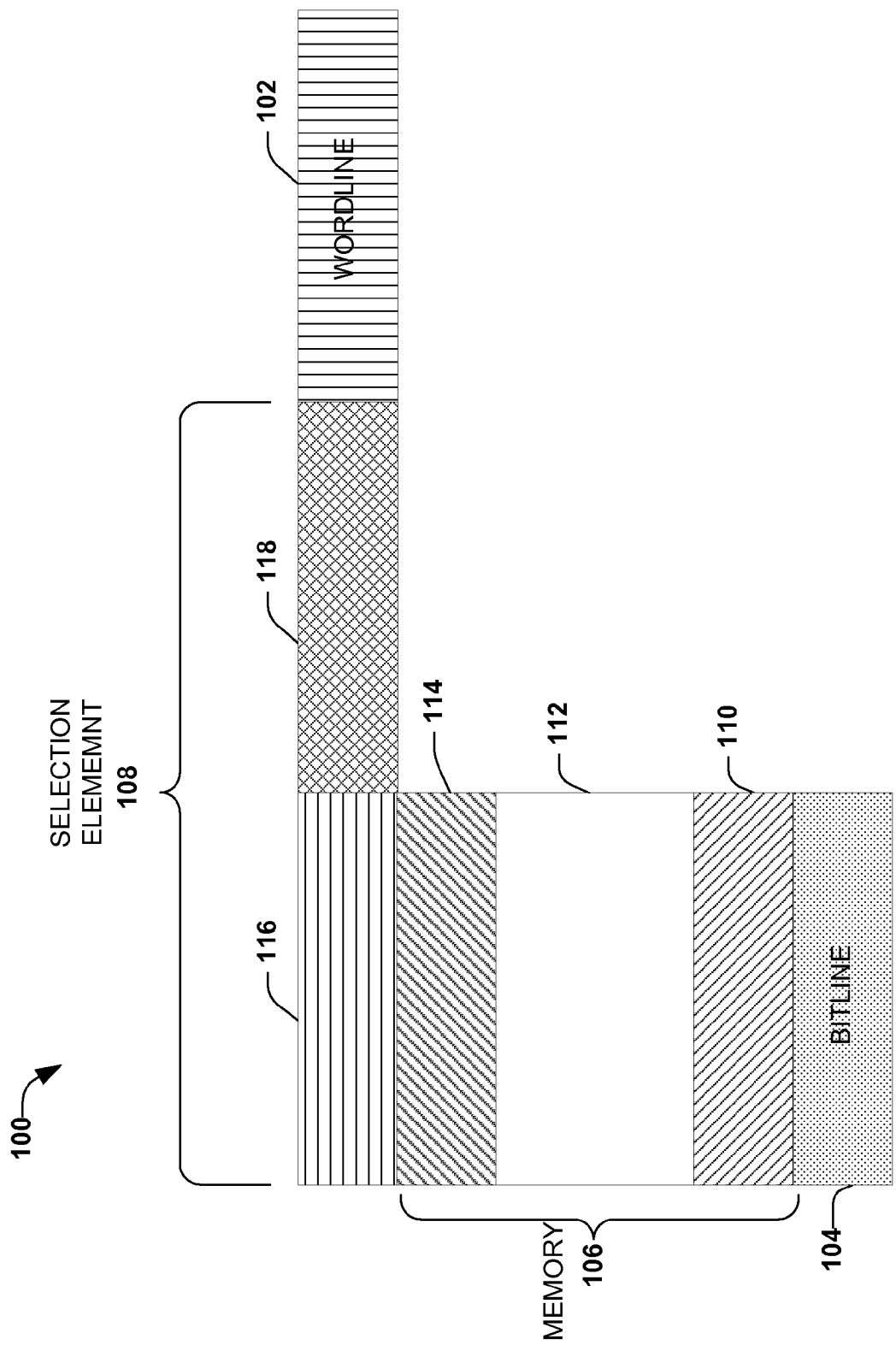
FIG. 1 illustrates exemplary layers of a typical memory array for a single memory device with a selection element in a layer of a control line.

The subject invention provides a semiconductor memory device with a selection element in a substantially similar layer as a control line, which can reduce complexity associated with vertical stacking techniques utilized to implement memory devices. The invention further provides methods of making such memory devices. The selection element facilitates selection of a specific memory element to be written, read, or erased. Traditional memory devices generally form the selection element through the deposition of separate layers within a semiconductor chip, and many conventional memory arrays stack memory devices, for example, one upon another, in a vertical manner, which can increase the number of memory devices stacked upon another. The subject invention reduces complexity of vertical stacking by incorporating the selection element (e.g. a diode) into the layer where one of the control lines (e.g. a wordline and a bitline) resides. In one aspect of the invention, the selection element is a selection diode, and the memory element is further coupled to a second control line fabricated in a disparate layer.

As used in this application, the term "component" is intended to refer to a computer-related entity, either hardware, a combination of hardware and software, software, or software in execution. For example, a component may be, but is not limited to being a process running on a processor, a processor, an object, an executable, a thread of execution, a program, a set of co-operating computers and/or processes and a computer. In addition, as used in the application the term "memory element" is intended to refer to the necessary circuitry to implement a memory function for a single bit of information. A memory element is that circuitry which is selected, written, erased or read by other supporting circuitry. The term "memory device" is intended to refer to a memory element and a selection element, the selection element comprising the necessary circuitry to facilitate a specific memory element being "selected" for purposes of being written, read or erased through application of control voltages to control lines. The terms "memory array" and "memory component" are intended to refer to a component comprising one or more memory devices.

The subject invention is now described with reference to the drawings. In the following description, for purposes of explanation, numerous specific details are set forth in order to provide a thorough understanding of the invention. It may be evident, however, to one skilled in the art that one or more aspects of the invention may be practiced with a lesser degree of these specific details. In other instances, known structures and devices may be shown in block diagram form in order to facilitate describing one or more aspects of the invention. The following detailed description is of the best mode presently contemplated by the inventors for practicing the invention. It should be understood that the description of these aspects are merely illustrative and not limitative.

FIG. 1 illustrates various layers within a memory array of a single memory device 100. The memory device 100 comprises a wordline 102, a bitline 104, a semiconductor memory element 106 and a diode 108. The semiconductor memory element 106 comprises a first electrode 110, one or more organic/inorganic layer(s) 112, and a second electrode 114. The diode 108 comprises an area of n-doped material 116 and an area of p-doped material 118, both of which are fabricated within a substantially similar layer as the wordline 102. Such arrangement can reduce the number of layers utilized to implement the memory device 100 and, thus, reduce vertical stacking complexity of the memory device 100. It is understood that although FIG. 1 depicts the diode 108 in the wordline layer, the diode 108 can alternatively be fabricated in the layer (e.g., the same or substantially similar layer) where the bitline resides. Furthermore, the diode 108 is depicted with a typical p-n junction between n-doped material and p-doped material, however, it is understood that the any suitable diode materials which possesses the necessary switching characteristics to write, read and erase the memory element as described herein can be utilized. It is further understood that the diode 108 can be a p-n junction type diode, a Schottky diode, a Zener diode, or other suitable entity possessing similar diode like properties.

Figure 2:
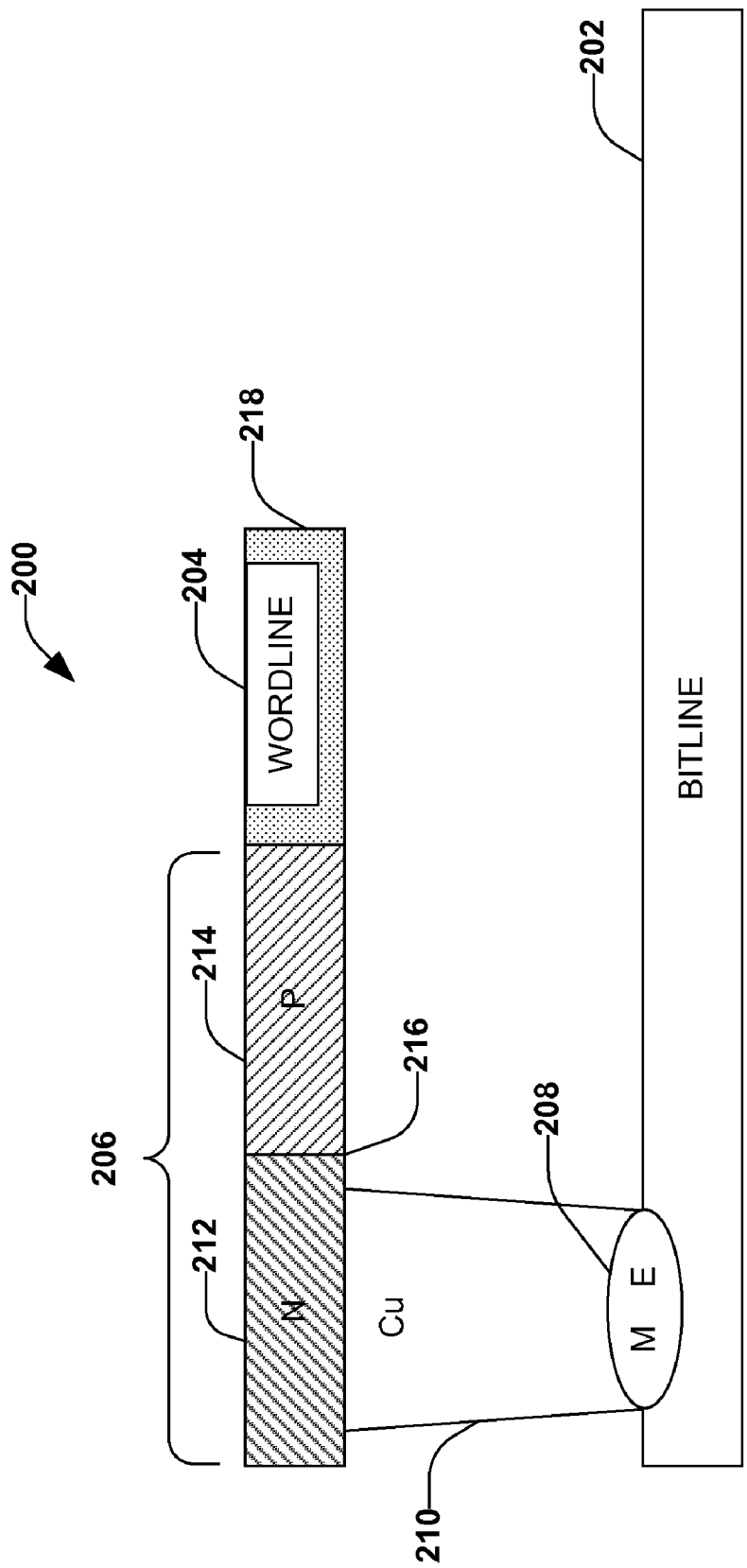
FIG. 2 illustrates an exemplary memory device with a selection element in a control line layer.

FIG. 2 illustrates a memory device 200 in accordance with an aspect of the invention. The memory device 200 comprises a bitline 202, a wordline 204, a diode 206, and a memory element 208. As depicted, the bitline 202 and the wordline 204 are formed as copper damascenes, but it is understood that any suitable conductive material can be utilized. For example, materials such as aluminum, chromium, gold, magnesium, manganese, indium, iron, nickel, palladium, platinum, silver, titanium, zinc, alloys thereof, indium-tin oxide, polysilicon, doped amorphous silicon, metal silicides, and the like can be utilized. Exemplary alloys that can be utilized for the conductive material include Hastelloy®, Kovar®, Invar, Monel®, Inconel®, brass, stainless steel, magnesium-silver alloy, and various other alloys.

To form the memory device 200, an interlayer dielectric stack is deposited upon a layer containing the bitline 202. A via opening is formed in such dielectric stack and the memory element 208 is formed within the via opening. The via 210 is filled with a barrier metal and a copper. As described herein, any suitable conductive material can be utilized as an alternative to copper. A wordline layer is deposited upon the layer comprising the copper filled via. A portion of the wordline layer is masked, exposed and etched for fabrication of the diode 206. Germanium or the like can be deposited into the portion of the layer etched for the diode 206, for example. Alternative materials include, for example, Gallium Arsenide or Aluminum with n-type silicon. Moreover, the diode 206 can be a p-n junction type diode, a Schottky-type diode, a Zener diode and the like.

The diode 206 is comprised of a n-doped region 212 and a p-doped region 214, wherein the n-doped region 212 and the p-doped region 214 are masked and implanted in the Germanium or other material and annealed. The junction of the n-doped region 212 and the p-doped region 214 form a p-n junction 216. An area for the wordline is masked and etched within a layer. A barrier metal 218 is deposited and copper is deposited to form the wordline 204. In accordance with an aspect of the invention, the n-doped region 212, p-doped region 214, and wordline 204 are all created in the same layer, thereby reducing the vertical stacking required to implement the memory device. The copper filled via 210 serves to couple memory element 208 to the n-doped region 212 of diode 206.

Figure 3:
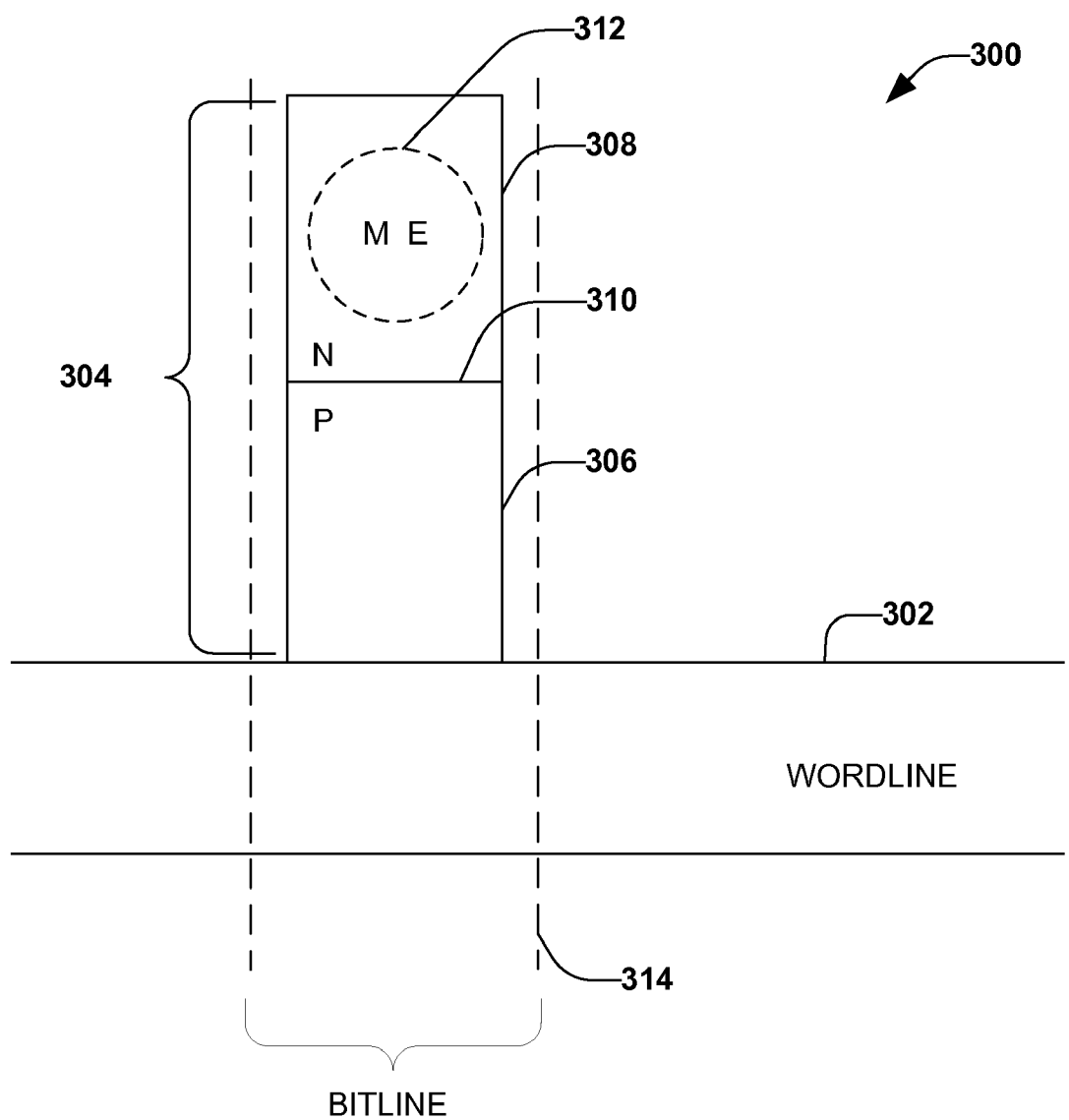
FIG. 3 illustrates an exemplary memory device with a selection element in a layer as a control line.

FIG. 3 illustrates a memory device 300 that comprises a wordline 302 and a diode 304 that are fabricated within a substantially similar layer. The wordline 302 is proximate a p-doped region 306 of the diode 304 and a n-doped region 308 resides proximate a p-doped region 306, thus creating a p-n junction 310. A memory element 312 is coupled to the n-doped region 308 by a metal via (not shown). The memory element 312 is further coupled to a bitline 314. In accordance with an aspect of the invention, the n-doped region 308, the p-doped region 306, and the wordline 304 are formed in a substantially similar layer, thereby reducing vertical stacking requirements of the memory device 300.

Figure 4:
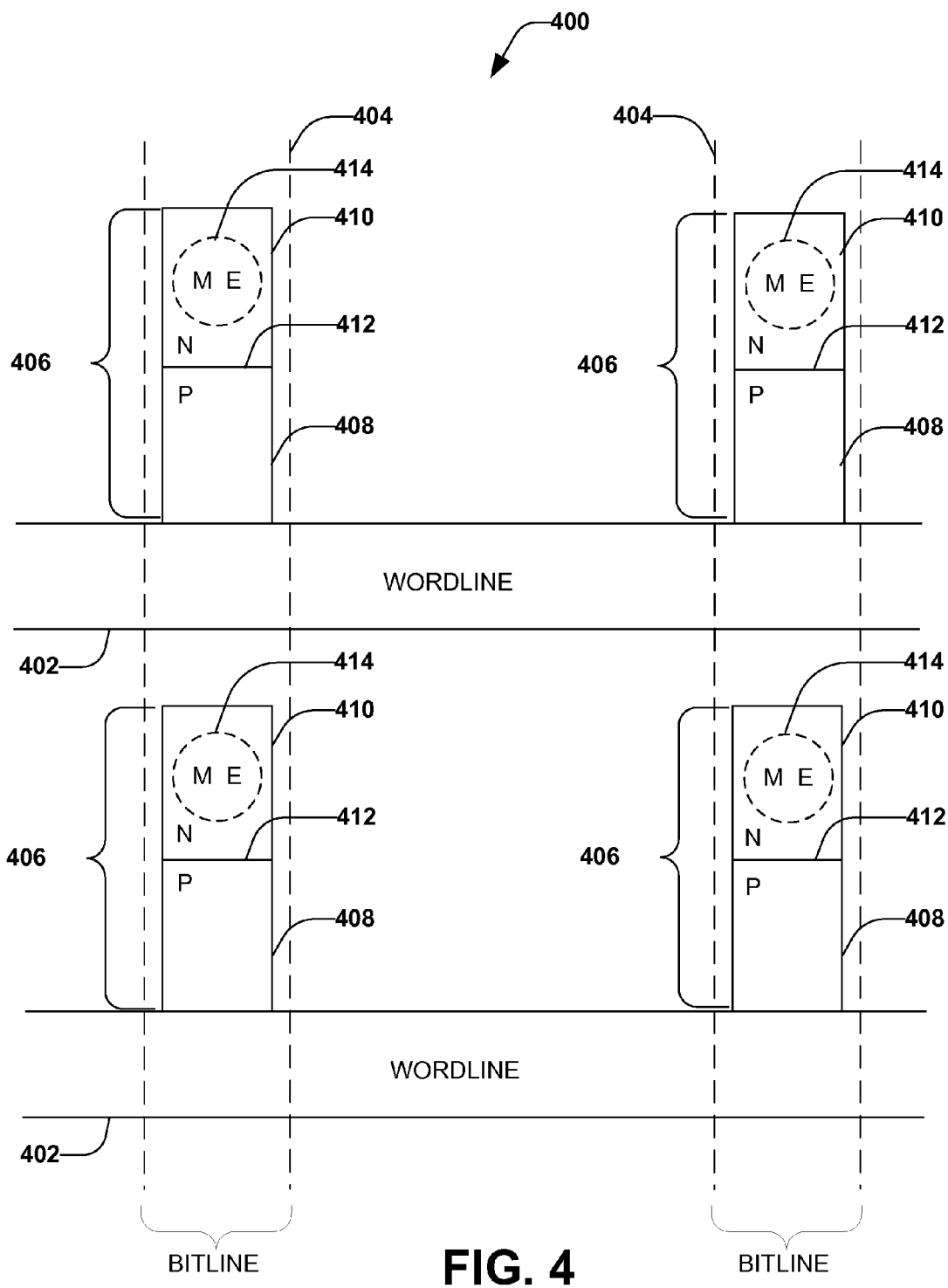
FIG. 4 illustrates a memory array comprising an array of memory devices with a selection element in a layer of a wordline.

FIG. 4 illustrates a memory array 400 comprising an array of memory devices wherein a selection element is fabricated in a substantially similar layer as a wordline. A two dimensional array 400 comprising four memory devices is illustrated, but is understood that the memory array 400 can be any dimension to facilitate essentially any number of memory elements. The memory array 400 comprises one or more wordlines 402 and one or more bitlines 404, which are utilized to apply control voltages to control the memory array 400. Abutting each wordline is one or more diodes 406. Respective diodes 406 are comprised of a p-doped region 408 and an n-doped region 410, and the junctions of the n-doped regions 408 and p-doped regions 410 form p-n junctions 412. Associated with each diode 406 is a memory element 414 that is coupled to at least one of the bitlines 404. Coupling each memory element 414 to the associated n-doped region 410 is a metal filled via (not shown).

Figure 5:
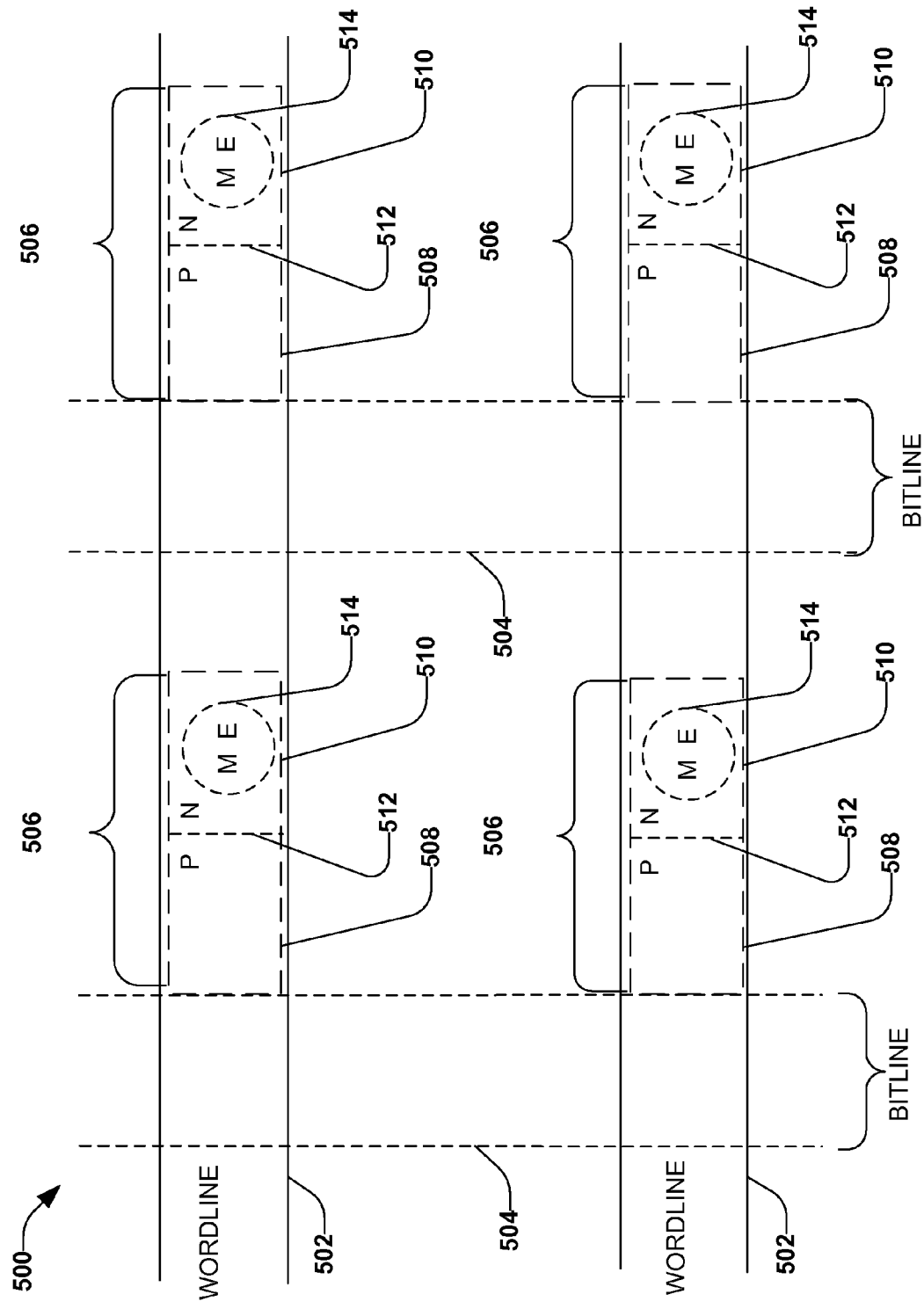
FIG. 5 illustrates an exemplary memory array comprising an array of memory devices with a selection element in a layer of a bitline.

FIG. 5 illustrates a memory array 500 comprising an array of memory devices wherein a selection element is fabricated in a substantially similar layer as a bitline in accordance with an aspect of the invention. A two dimensional array of four memory devices is depicted; however, it is to be appreciated that the array can be essentially any size. The memory array 500 comprises one or more wordlines 502 and one or more bitlines 504, which apply control voltages to facilitate control of the memory array 500. Formed next to the bitlines are one or more diodes 506, wherein respective diodes 506 comprise a p-doped region 508 and an n-doped region 510. The junctions of the n-doped regions 510 and p-doped regions 508 form p-n junctions 512. Associated with each diode 506 is a memory element 514 that is coupled to a wordline 502, and each memory element 514 is coupled to the associated n-doped region 510 via a metal filled via (not shown).

Figure 6:
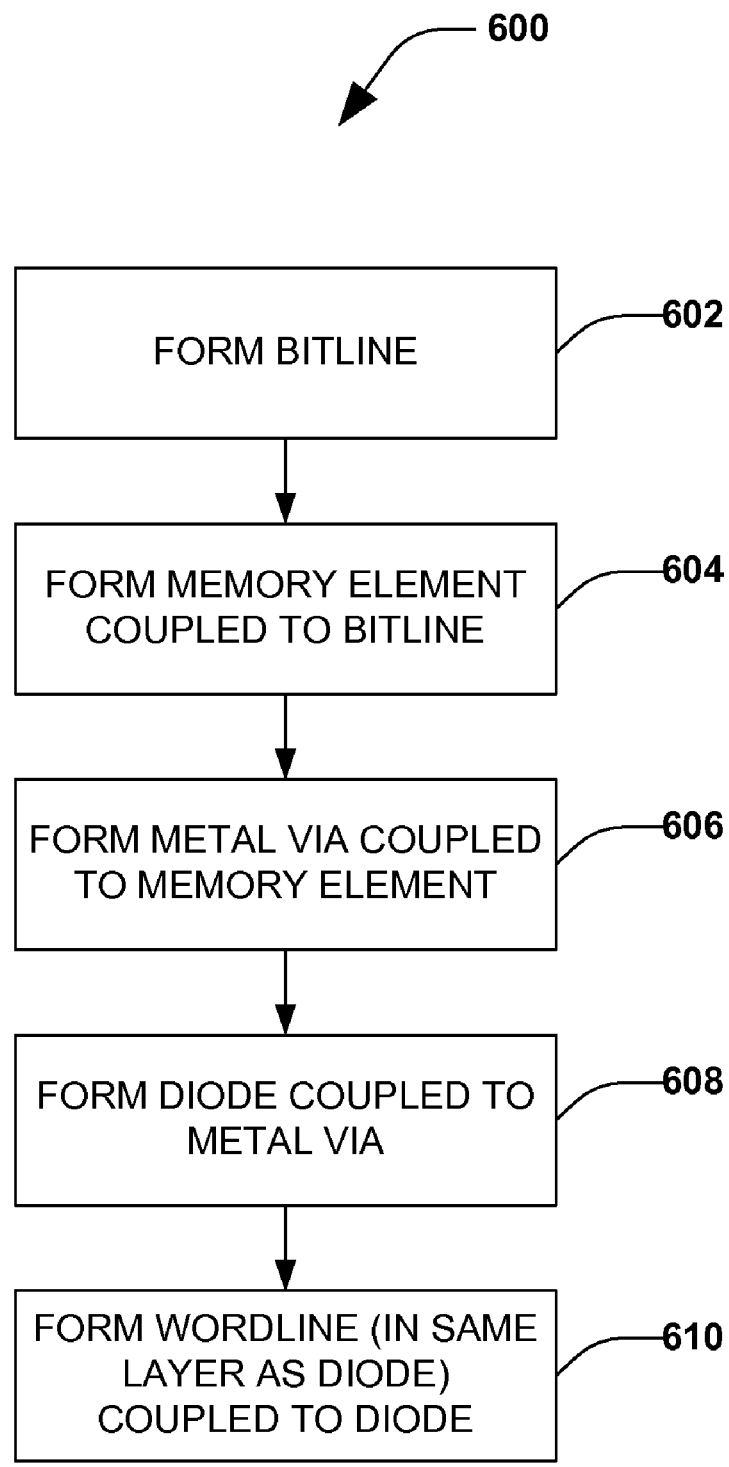
FIG. 6 illustrates an exemplary methodology for forming a semiconductor memory device with a selection element in a layer with one control line.
Figure 7:
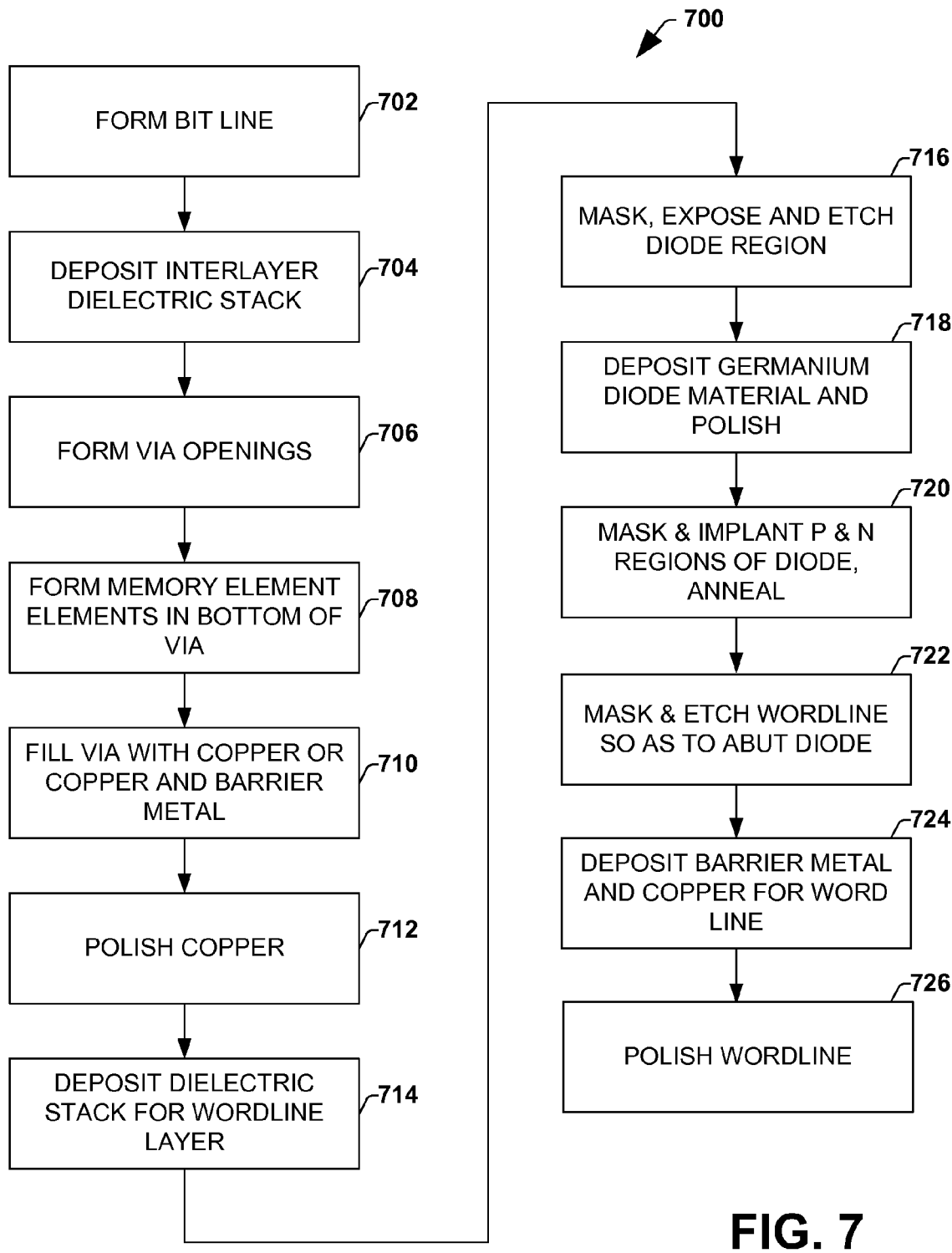
FIG. 7 illustrates an exemplary methodology for forming a semiconductor memory device with a selection element in one of a wordline and a bitline layer.

In view of the exemplary systems shown and described herein, methodologies, which may be implemented in accordance with one or more aspects of the invention, can be appreciated with reference to the flow diagrams of FIG. 6 and FIG. 7. While for purposes of simplicity of explanation, the methodologies are shown and described as a series of acts, however, it is to be understood and appreciated that the invention is not limited by the order of the act, as some acts can, in accordance with the invention, occur in different orders and/or concurrently with other acts from that shown and described herein. Moreover, not all illustrated acts may be required to implement the methodologies. In addition, it is to be appreciated that the various acts may be implemented via software, hardware a combination thereof or any other suitable means (e.g. device, system, process, component) for carrying out the functionality associated with the blocks. It is also to be appreciated that the acts are merely to illustrate certain aspects of the invention in a simplified form and that these aspects may be illustrated via a lesser and/or greater number of acts.

FIG. 6 is a flow diagram illustrating a methodology 600 for forming a semiconductor memory device with a selection element in a substantially similar (e.g., same) layer as one of a wordline and a bitline. At 602, one bitline is formed. It is understood that more than one bitline can be formed in order to facilitate manufacture of a one dimensional, two dimensional, three dimensional, etc. memory array in accordance with an aspect of the invention. Such bitline can be a copper filled damascene, however, it is understood that the bitline can be formed out of any suitable conductive material such as aluminum, chromium, gold, magnesium, manganese, indium, iron, nickel, palladium, platinum, silver, titanium, zinc, alloys thereof, indium-tin oxide, polysilicon, doped amorphous silicon, metal silicides, and the like. Exemplary alloys that can be utilized for the conductive material include Hastelloy®, Kovar®, Invar, Monel®, Inconel®, brass, stainless steel, magnesium-silver alloy, and various other alloys. Furthermore, the bitline is not required to be a damascene; rather the bitline can be formed as any feature, in any manner, suitable to function as a bitline.

At 604, a memory element is formed. The memory element can be formed in any suitable method including organic and inorganic materials and methods and is coupled to the bitline. At 606, a metal via is formed to couple the memory element to a selection device formed at 608. Although described as a metal via, it is understood that any conductive feature can be created to couple the memory element to the selection element. At 608, a diode is formed and coupled to the metal via. In one example, a Germanium diode is created by forming adjacent regions of n-doped material and p-doped material. Such n-doped region is coupled to the metal via and the p-doped material to create a p-n junction. Although described herein as a Germanium diode, it is understood that other materials may be used such as, for example Gallium Arsenide or Aluminum with n-type silicon. Moreover, the diode may be a p-n junction type diode, a Schottky-type diode, a Zener diode or any diode type function which may be achieved by any materials suitable to function in the manner described herein.

At 610, a wordline is formed in the layer that the diode is formed in and the wordline abuts the p-doped region of the diode. The wordline can be a copper or other conductive material filled damascene. Suitable alternatives to copper include aluminum, chromium, gold, magnesium, manganese, indium, iron, nickel, palladium, platinum, silver, titanium, zinc, alloys thereof, indium-tin oxide, polysilicon, doped amorphous silicon, metal silicides, and the like, and exemplary alloys include Hastelloy®, Kovar®, Invar, Monel®, Inconel®, brass, stainless steel, magnesium-silver alloy, and various other alloys. Furthermore, the wordline is not required to be a damascene as described herein.

FIG. 7 illustrates a flow diagram 700 for forming a semiconductor memory device with a selection element in a layer of a wordline. At 702, one or more bitlines are formed. Such bitlines can be a copper filled damascene or damascene of other conductive material as described herein. Alternatively, the bitline can be formed as any feature, in any manner, suitable to function as a bitline. At 704 an interlayer dielectric stack is deposited upon the layer comprising the bitline. The dielectric stack can be formed of any suitable dielectric material. At 706, a via is formed within the dielectric material creating an opening in the dielectric material. The opening in the dielectric material is aligned so that the opening will expose a portion of the bitline formed in the layer below. Any suitable method can be used to create the via opening in the dielectric such as, for example, masking followed by dielectric etching with a suitable solution. At 708, a memory element is formed in the bottom of the via. The memory element may be formed by any suitable method including organic and inorganic materials and methods. The memory element in the via is coupled to the bitline, which is exposed at the bottom of the via opening. After completion of the formation of the memory element, the balance of the via is filled with a conductive material (e.g., as described herein) at 710. It is further understood that the metal filling the via can also be surrounded by a barrier metal that forms a barrier between the metal inner core and the dielectric.

At 712, the copper or other conductive material and the barrier metal are polished to prepare for deposition of an additional layer on top of the dielectric layer comprising the metal filled via coupled to the memory element. Once prepared, a second dielectric stack is deposited on top of the dielectric layer comprising the metal filled via coupled to the memory element. Within this second dielectric stack, a selection element (e.g. a diode) can be formed along with the wordline. At 716, a region is masked, exposed and etched for creation of the diode. The region selected, upon dielectric etch, can expose the copper via that is coupled to the memory element, which facilitates coupling the metal via to the diode when the diode is formed. Any suitable method for masking, exposing and etching a region of the chosen dielectric layer may be utilized. At 718, Germanium or other suitable material (e.g., as described herein) is deposited into the region etched for creation of the diode. Once the Germanium or other suitable diode material is deposited, the diode material is polished.

At 720, the diode material is successively masked, implanted and annealed to form an n-doped region and an adjacent p-doped region. A p-n junction is formed at the interface of the p-doped region and n-doped region. The n-doped region is created in a region that exposed the metal via prior to deposition of the diode material. The diode is coupled to the memory element by virtue of the metal via formed at 710. At 722, in the layer that the diode resides within, an area abutting the p-doped region of the diode is masked and etched to facilitate the formation of a wordline. Any suitable method for masking, exposing and etching a trench in the chosen dielectric layer may be utilized. At 724, copper or other suitable material, as described herein, is deposited into the area etched for formation of the wordline. At 726 the wordline is polished. Subsequently, the methodology can continue with steps to implement any additional function.

Figure 8:
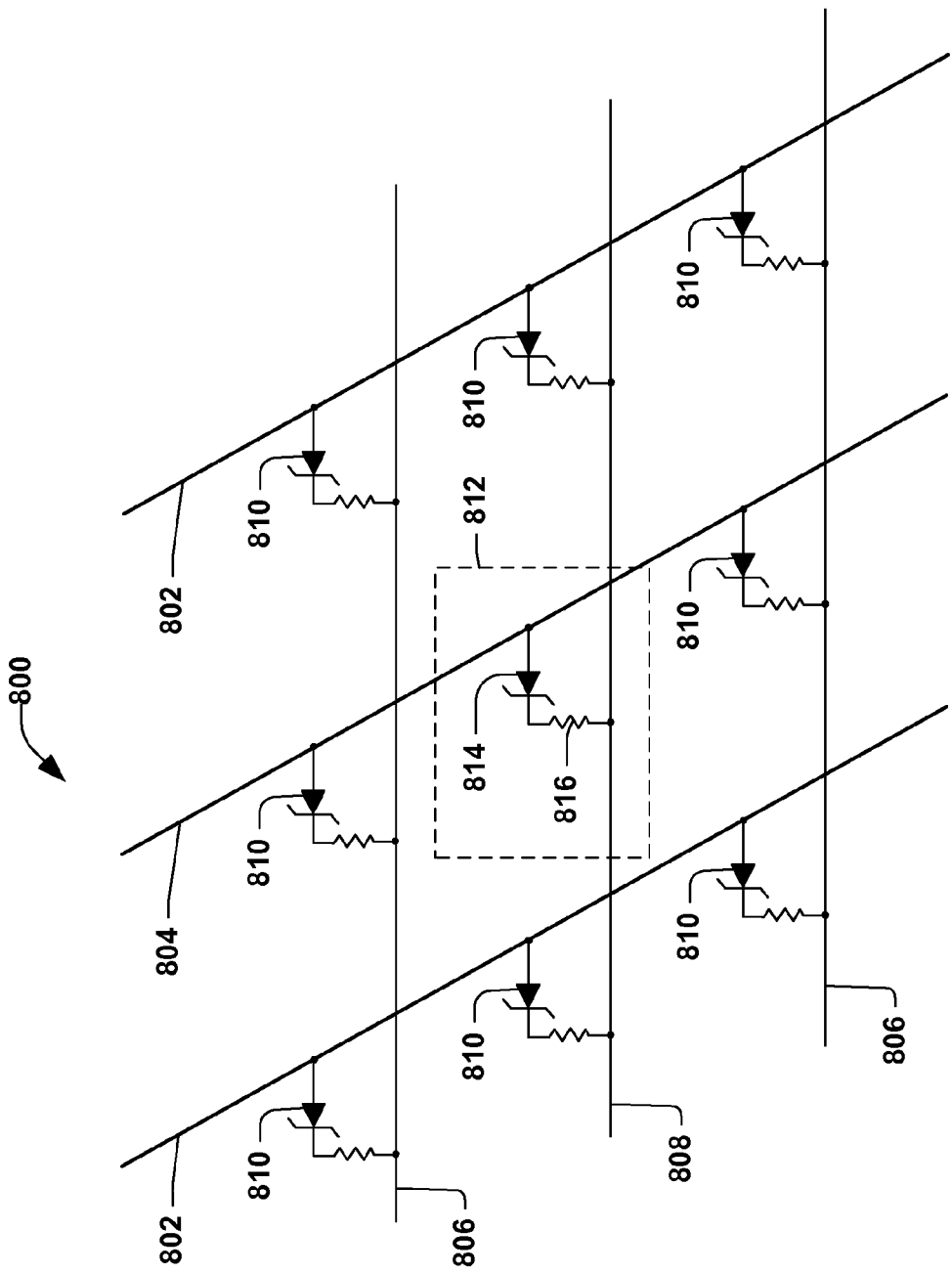
FIG. 8 illustrates an exemplary memory array with a selection element formed in the layer of a wordline.

FIG. 8 illustrates a memory array 800 with a selection device formed in a wordline layer in accordance with an aspect of the invention. The memory array 800 is comprised of memory devices 810 and 812, which are coupled between upper control lines (e.g., wordlines) 802 and 804 and lower control lines (e.g. bitlines) 806 and 808. The memory devices 810 and 812 comprise a diode 814 and a memory element 816, represented as a resistive element. In accordance with one aspect of the invention, the diodes 814 can be a zener diode, a Schottky-type diode, a normal p-n junction type diode or other similar device. In one instance, the memory elements 816 form volatile memory components such as RAM. RAM is available in many forms such as, for example synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). RAM can be comprised of inorganic elements, organic elements or a combination of both inorganic and organic elements. In another instance, the memory elements 816 form non-volatile memory components. Examples of non-volatile memory components include, ROM, programmable read only memory (PROM), erasable programmable read only memory (EPROM), electrically erasable programmable read only memory (EEPROM), flash EEPROM the like.

The diodes 814 are illustrated as being lateral to (in the same layer as) wordlines 802 and 804. Similarly, the memory elements 816 are illustrated as being in a layer below the diode and above the bitlines 806 and 808. When a particular memory device, for example memory device 812, needs to be written, erased, or read, control voltages are applied to the appropriate wordline 804 and bitline 808 to accomplish the desired action. The characteristics of the diodes 814 allow only the appropriate memory element 816 associated with the semiconductor memory device 812 to be accessed. The appropriate control voltages applied to the wordline and bitline required to write to a logic "1" state, erase to a logic "0" state and read the state of the memory element are a function of the specific diode and memory elements implemented and are discussed in detail below. It is to be appreciated that the orientation of the diode as depicted in FIG. 8 is illustrative and can be variously oriented in accordance with aspects of the invention.

Figure 9:
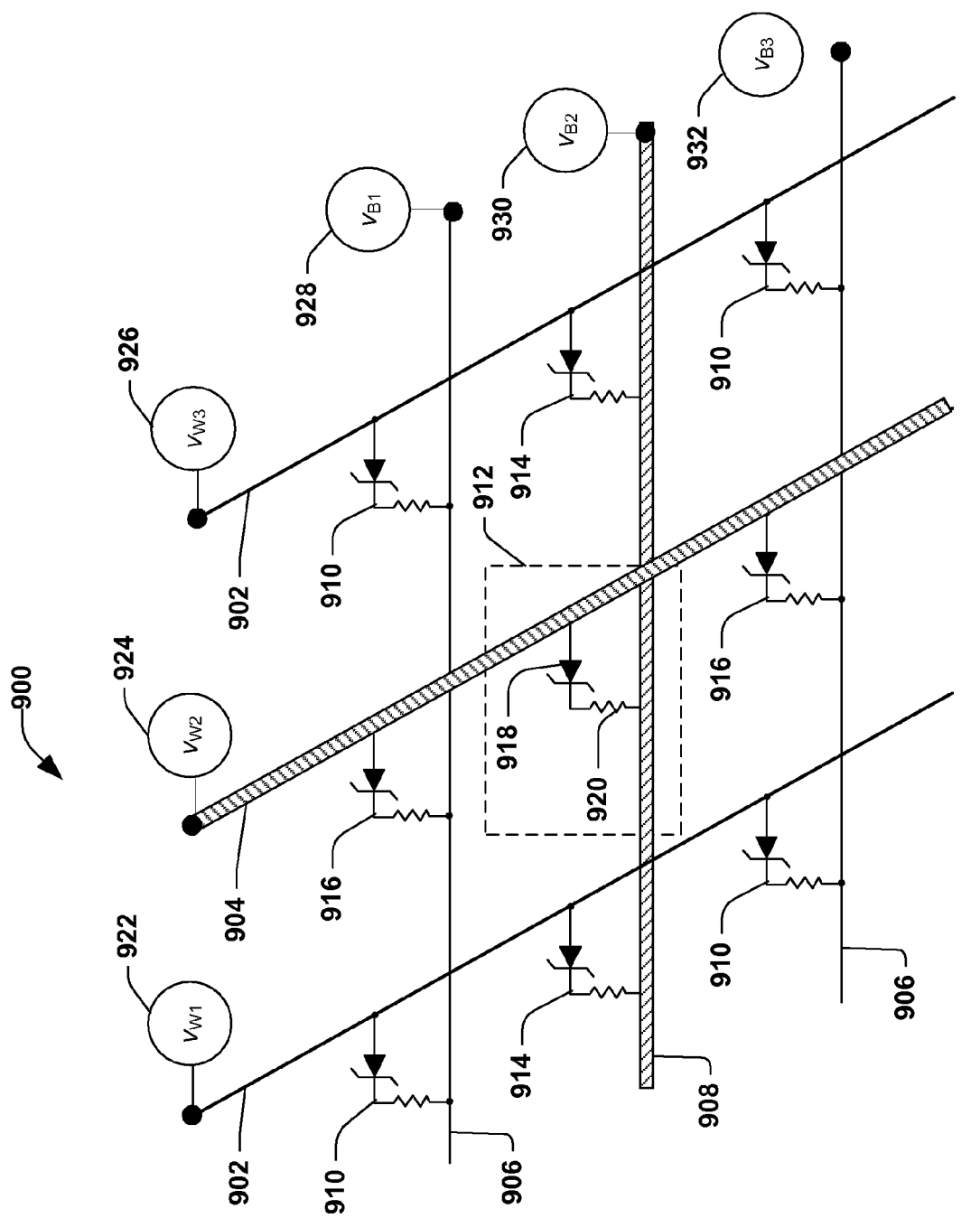
FIG. 9 illustrates an exemplary array of memory devices with a selection element formed with a wordline in a layer.

FIG. 9 illustrates another memory array 900 in accordance with an aspect of the invention. The memory array 900 includes a selection device formed within a layer with a wordline. The memory array 900 is comprised of memory devices 910, 912, 914 and 916 that are coupled between upper control lines (e.g., wordlines) 902 and 904 and lower control lines (e.g. bitlines) 906 and 908. Each memory device 910, 912, 914 and 916 comprises a diode 918 and a memory element 920. In accordance with one aspect of the invention, the diodes 918 can be zener diodes, a Schottky diodes, a normal p-n type junction diodes or other similar devices. The diodes 918 are illustrated as being lateral to (in the same layer as) wordlines 902 and 904. Similarly, the memory elements 920 are illustrated as being in a layer below the diodes and above the bitlines 906 and 908.

When memory device 912 is written, erased, or read, control voltages are applied to the wordline 904 and the bitline 908. Characteristics of the diodes 918 generally only allow the appropriate memory element 920 to be written, erased or read. Each wordline and bitline is coupled to a unique voltage source, 922, 924, 926, 928, 930, and 932. For example, the wordline 904 is connected to a voltage source 924, $V_{W2}$ and the bitline 908 is coupled to a voltage source 930, $V_{B2}$. Although multiple memory devices 916 and 912 are coupled to the wordline 904 and multiple memory devices 914, 912 are coupled to the bitline 908, only a single memory device 912 is coupled to both the wordline 904 and the bitline 908. Therefore, a combination of voltages applied by $V_{W2}$ and $V_{B2}$ can be utilized to alter the contents of memory device 912 while the other memory devices, 914 and 916 that are connected to only one of the wordline 904 and the bitline 908, remain unaltered. The memory devices 910, not connected to either the wordline 904 or the bitline 908, are not affected by the programming of the desired memory device 912.

By way of example, typical working voltages employed in the following examples to demonstrate the effects on the various memory devices of memory array 900. It is understood that other values can be used without altering the scope of the invention. In the following example, memory devices in array 900 are fabricated with zener characteristics possessing a reverse breakdown voltage of approximately 4 volts. Given that characteristic, the following applied voltages can be utilized to write a memory device to a logic "1" state, to erase a memory device to a logic "0" state, and to read the state of a memory device without changing the state of the memory element.

To write the desired memory device 912, the following approximate control voltages can be applied by the appropriate voltage sources: $V_{W1}=V_{W3}=0.0$ volts, $V_{W2}=1.0$ volts, $V_{B2}=0.0$ volts, $V_{B1}=V_{B3}=1.0$ volts. Applying such voltage levels can turn on the diode 918, which can result in a 1.0 volt drop across the desired memory element 920, causing it to be written to a logic "1" state. The memory devices 916 coupled to the bitline and memory devices 914 coupled to the wordline have 0.0 volts across them and are therefore unaltered. The remaining memory devices 910 in the array 900 have a −1.0 volt drop across them, insufficient to cause breakdown of their diodes, and therefore their memory elements are unaltered by application of these control voltages.

To erase the desired memory device 912, the following approximate control voltages are applied by the appropriate voltage sources: $V_{W1}=V_{W3}=2.0$ volts, $V_{W2}=0.0$ volts, $V_{B2}=4.0$ volts, $V_{B1}=V_{B3}=2.0$ volts. These voltage levels result in the diode 918 breaking down (e.g., reverse breakdown) and produce a −4.0 volt drop across the memory element 920, causing its state to be set to a logic "0", or in other words, erased. The memory devices 916 coupled to the bitline and the memory devices 914 coupled to the wordline have −2.0 volts across them, insufficient to cause their diodes to breakdown. Therefore, the contents of these memory devices remain unaltered. The remaining memory devices 910 in the array 900 have a 0.0 volt drop across them and their contents are therefore unaltered.

To read the desired memory device 912, the following approximate voltages are applied by the appropriate voltage sources: $V_{W1}=V_{W3}=0.0$ volts, $V_{W2}=+V_{sen}$ volts, $V_{B2}=0.0$ volts, $V_{B1}=V_{B3}=0.5$ volts. $V_{sen}$ is a just above the forward threshold voltage of the diode and less than the voltages applied to $V_{B1}$ and $V_{B3}$. These applied voltage levels produce a $V_{sen}$ volt drop level across the desired memory device 912. This voltage, just sufficient to turn on the diode, but less than the programming voltage, allows the memory device to be read without changing the state of the memory element. The memory devices 916 coupled to the bitline are forced to (Vsen−0.5) volts, insufficient to cause their diodes to breakdown and the contents of their memory elements, therefore remain unaltered. Memory devices 914 coupled to the wordline have a voltage drop of 0.0 volts across them and are therefore unaltered. Similarly, the remaining memory devices 910 in the array 900 have a −0.5 volt drop across them, insufficient to cause their diodes to breakdown and the contents of their memory elements, therefore, remain unaltered.

The functionality of the above memory devices can be described through the following relationships:

$$|V_{ERASE}| > |V_{PROG}| > |V_{READ}| \qquad (A)$$

$$|V_{REVERSE\ BREAKDOWN}| > |V_{FORWARD\ TURN\ ON}| \qquad (B)$$

where $V_{ERASE}$ is a voltage level required to erase a memory device to a logic "0", $V_{PROG}$ is a voltage level required to program (write) a memory device to a logic "1" and $V_{READ}$ is a voltage level required to read a state of a memory device without altering its state. $V_{REVERSE\ BREAKDOWN}$ is a reverse voltage level at which a zener diode breaks down and allows current to flow in a reverse direction. $V_{FORWARD\ TURN\ ON}$ is a forward voltage level required to turn a diode on to allow current to flow in a forward direction. These relationships are established based on absolute values of these voltage levels.

The values given herein are meant only to demonstrate the relationships and are not considered to be the only values or voltage levels appropriate for the invention. The above examples also exclude the actual voltage drop across the diode of the invention. A typical voltage drop value for a zener diode is approximately 0.6 volts for $V_{FORWARD\ TURN\ ON}$. If the desired memory element needs 1.0 volt applied across it to be written, then the applied control voltages need to be increased to provide a 1.6 volt drop across the entire memory device. This compensates for the diode drop of approximately 0.6 volts and still provides the 1.0 volt drop across the desired memory element. Similar appropriate adjustments in the control voltages are required for the read and erase functions. It is to be appreciated that the diode can be oriented in either direction.

Figure 10:
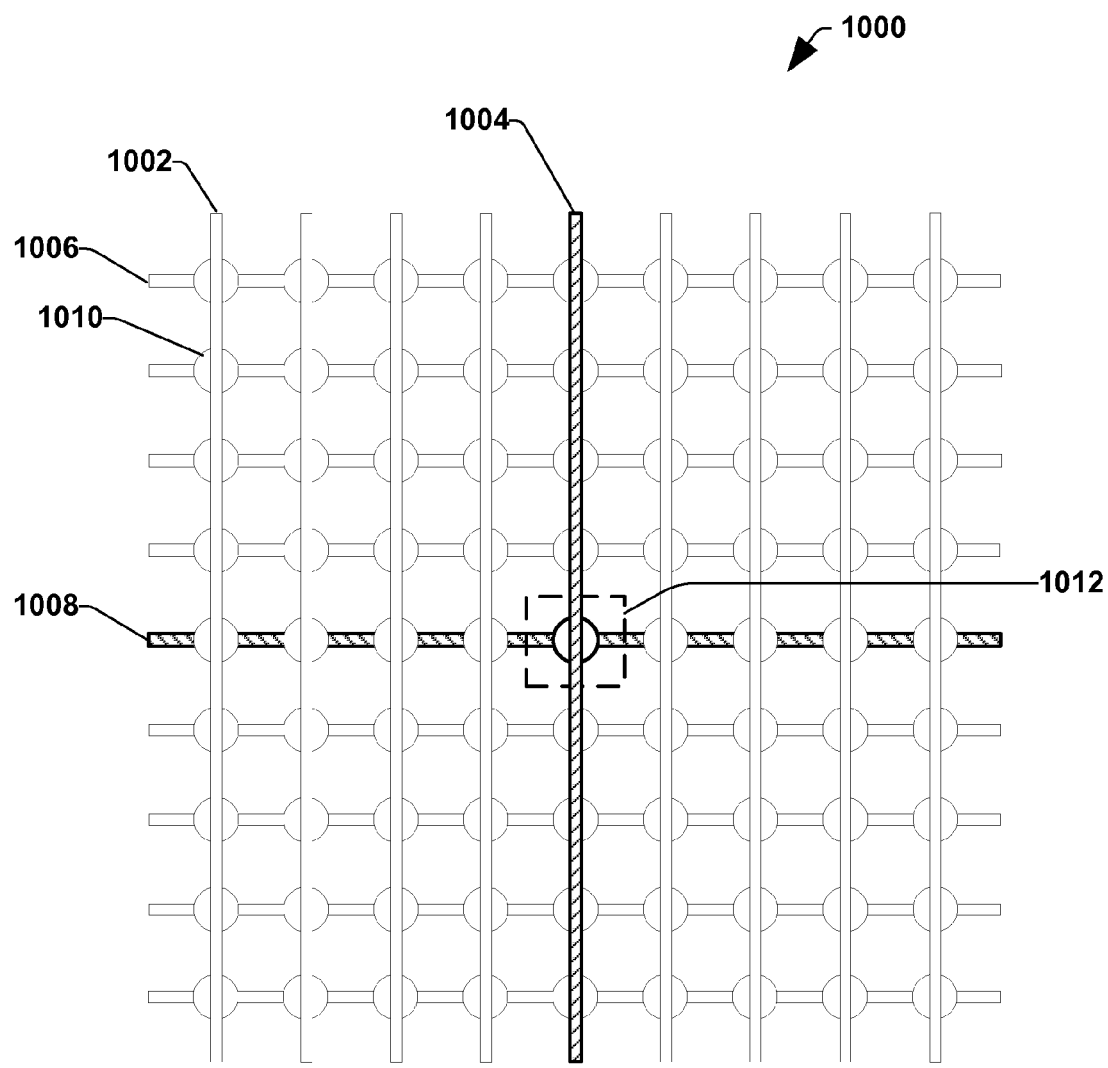
FIG. 10 is a diagram of a semiconductor memory array in accordance with an aspect of the invention.

FIG. 10 illustrates a portion of a semiconductor memory array 1000. The memory array 1000 is depicted with an array of 81 memory devices 1010, however, it is to be understood that the memory array 1000 can include more or less memory devices to accommodate essentially any number of memory devices. The memory array 1000 further comprises a plurality of control lines, including wordlines 1002 and 1004 and bitlines 1006 and 1008. Application of control voltages to the wordlines 1002 and 1004 and the bitlines 1006 and 1008 can result in writing, reading and erasing of one of the memory devices 1010. For example, application of suitable control voltages to the wordline 1004 and the bitline 1008 can result in a memory device 1012 being written, read, or erased, depending on the voltages applied.

Figure 11:
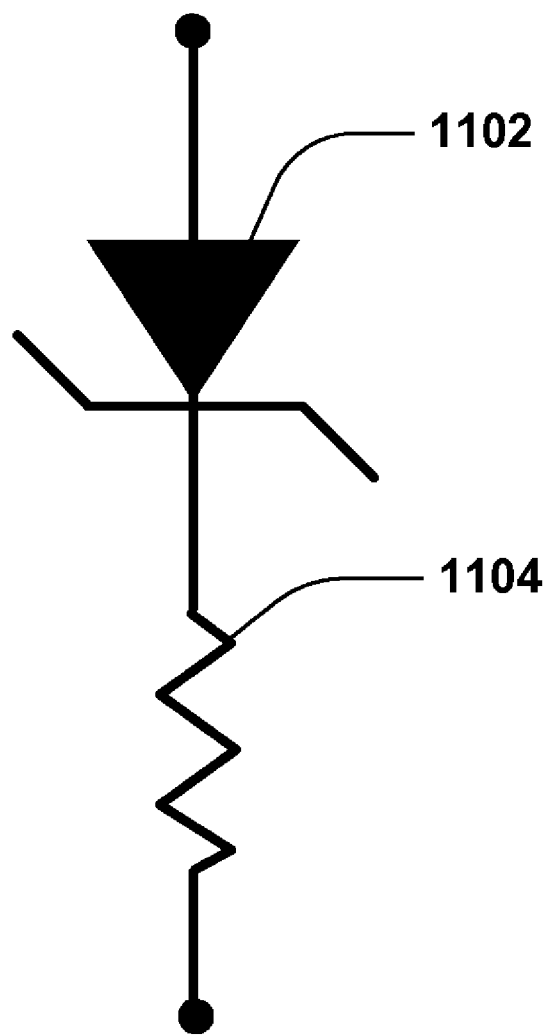
FIG. 11 is an illustration of a representative semiconductor memory device in accordance with an aspect of the invention.

FIG. 11 illustrates an exemplary semiconductor memory device 1100 that can be utilized in a memory array in accordance with an aspect of the invention. The semiconductor memory device 1100 is modeled as a Zener diode 1102 and a memory element 1104 (e.g., a resistor). The zener diode 1102 is representative of a lateral diode formed in a layer as one of the control lines in accordance with an aspect of the invention. The memory element 1104 is representative of a memory element that is capable of acquiring a logic state "1" by being written and a logic state "0" by being erased. The memory element 1104 is further capable of having its acquired state read without impacting its state. The Zener diode 1102 can operate as a conventional diode unless a specific predetermined reverse bias voltage is met or exceeded, which results in diode breakdown. During normal operation, current can flow through the memory element 1104 when a voltage sufficient to turn "on" the diode 1102 is applied across the memory device 1100. The nature of such diode allows application of various voltages to the memory device 1100 to facilitate writing the memory element, erasing the memory element, or reading the acquired state of the memory element. For instance, erasure of the memory element 1104 can be accomplished by applying a breakdown voltage to the zener diode.

Figure 12:
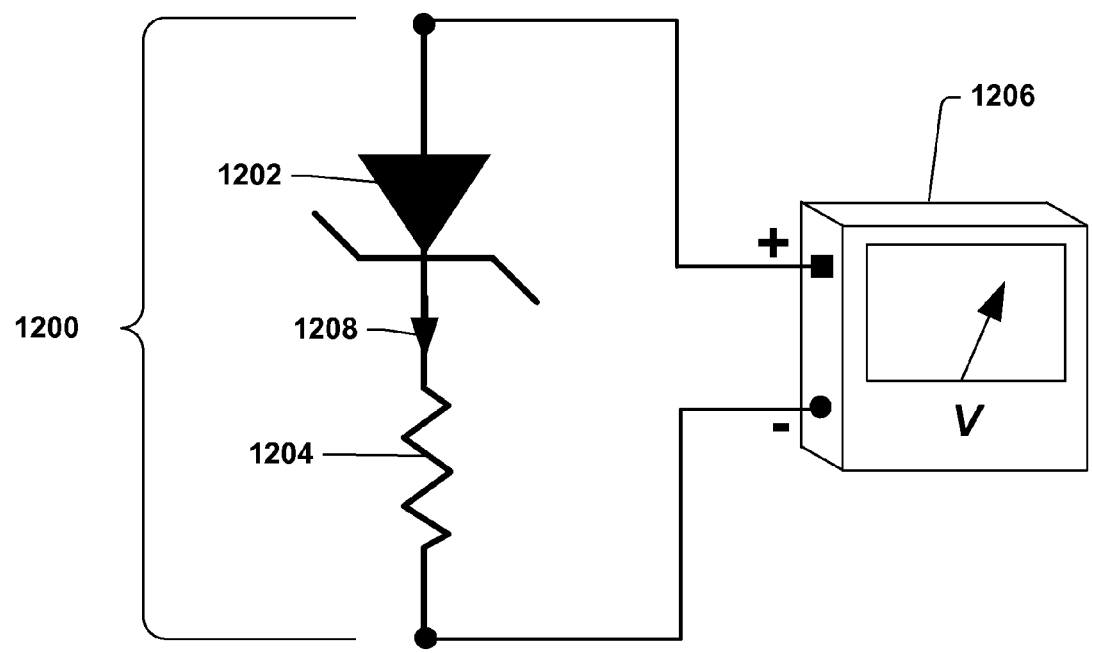
FIG. 12 is an illustration of a semiconductor memory device comprised of a zener diode and a memory element with a forward voltage applied in accordance with an aspect of the invention.

FIG. 12 illustrates a semiconductor memory device 1200 comprising a zener diode 1202 in conjunction with a memory element 1204. A forward bias voltage is applied across the memory device 1200 by voltage a source 1206. When the forward bias voltage is greater than a turn-on voltage of the zener diode 1202, a resulting current 1208 flows through the memory element 1204. The level of the current is dependent upon the voltage of the voltage source 1206, and applying a suitable forward bias voltage results in diode 1202 behaving as an effective short circuit allowing a node between the diode 1202 and the memory element 1204 to approximately equal the value of the applied voltage the forward turn-on voltage of the diode. A characteristic of the memory element 1204 can be such that when such voltage is applied, the memory element 1204 can acquire and retain a logic "1" state. In this manner, the memory element 1204 can be programmed or written to a logic "1".

Figure 13:
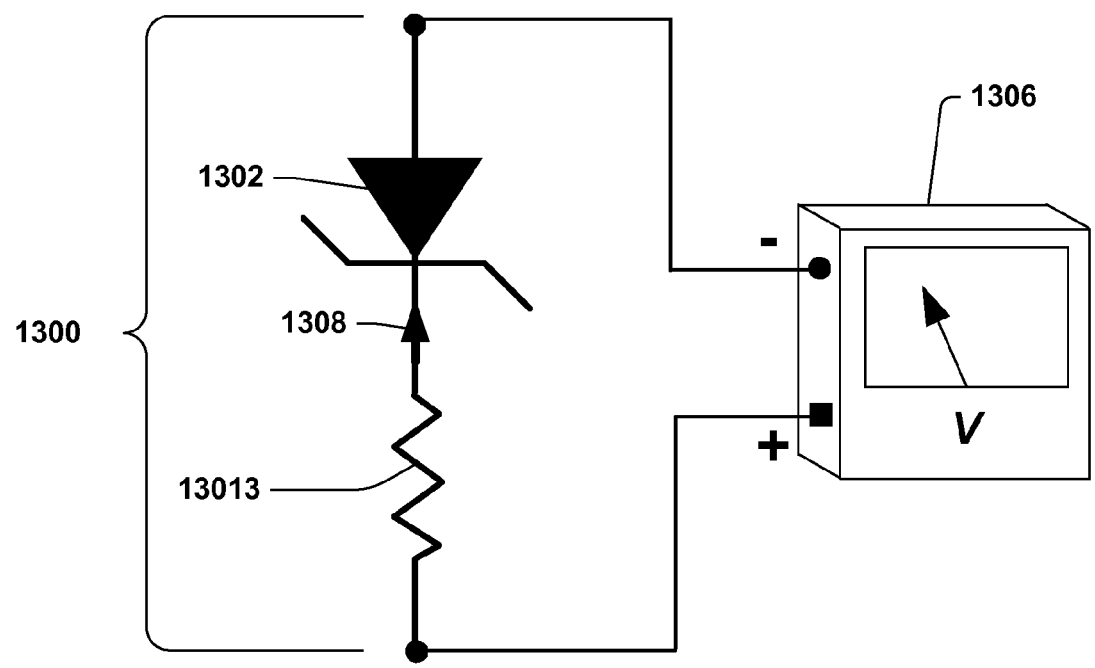
FIG. 13 is an illustration of a semiconductor memory device comprised of a zener diode and a memory element with a reverse bias voltage applied in accordance with an aspect of the invention.

In a similar manner, FIG. 13 illustrates a semiconductor memory device 1300 programmed or erased to a logic "0" state. The memory device 1300 comprises a zener diode 1302 and a memory element 1304. A reverse bias voltage can be applied across the memory device 1300 by a voltage source 1306. When the voltage source 1306 applies a reverse bias voltage greater than a zener diode breakdown voltage across the memory device 1300, breakdown occurs and a current 1308 flows through the memory element 1304. Applying a suitable reverse bias voltage results in the diode 1302 appearing as an effective short circuit allowing a node between the diode 1302 and the memory element 1304 to approximately equal the applied voltage less the reverse bias voltage. A characteristic of the memory element 1304 can be such that when such voltage is applied, the memory element 1304 can acquire and retain a logic "0" state. In this manner, the memory element 1304 can be programmed or erased to a logic "0" state.

When the reverse bias voltage is less than the breakdown voltage of the zener diode 1302, the diode leakage current generally is very small. Since the applied voltage across the diode 1302 is between the reverse bias breakdown voltage level and the forward bias voltage level, the diode 1302 appears as an open circuit. A characteristic of the memory element 1304 is such that when such voltage is applied, the memory element will retain its prior logic state. In this manner, the memory element 1304 can be read without altering its state.

Figure 14:
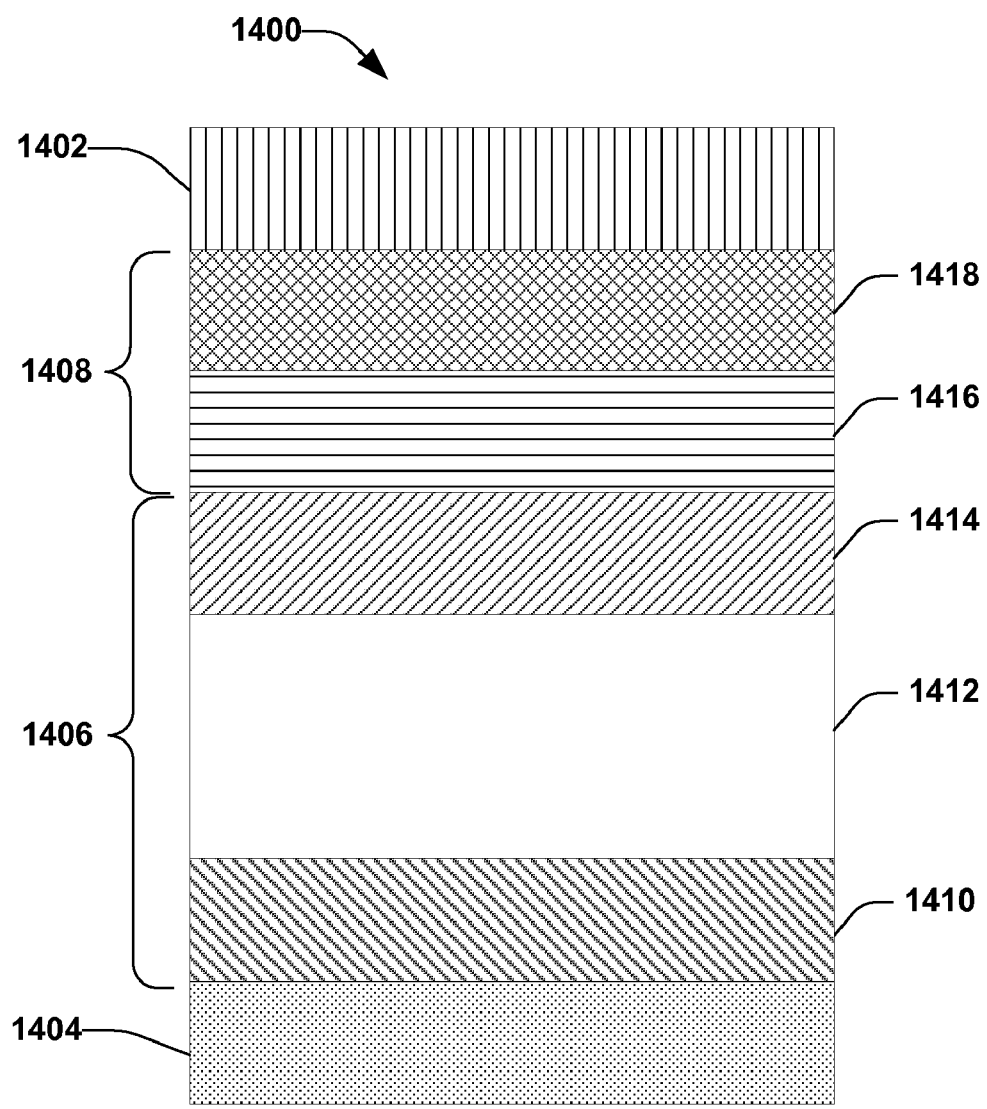
FIG. 14 is a diagram of layers involved in a typical memory array for a single memory device with a selection element in separate layers.

FIG. 14 illustrates various layers in a typical memory array of a single memory device 1400. In a typical memory device, implementation of a memory element requires fabrication of numerous layers. In order to implement a diode function, memory devices generally require deposit of at least two layers in addition to the layers required to implement the memory element. The resulting vertical stacking of a multitude of layers complicates the manufacturing process and the problem is further compounded when the memory array is three dimensional, in effect stacking memory device upon memory device. The memory device 1400 comprises a wordline 1402, a bitline 1404, a semiconductor memory element 1406 and a diode 1408. The semiconductor memory element 1406 comprises a first electrode 1410, one or more organic/inorganic layer(s) 1412, and a second electrode 1414. The diode 1408 comprises a layer of n-doped material 1416 and a layer of p-doped material 1418. In accordance with an aspect of the invention, the diode 1408 is incorporated into a substantially similar layer as either the wordline 1402 or the bitline 1404, thereby reducing complexity of vertical stacking required to implement the memory device 1400.

Figure 15:
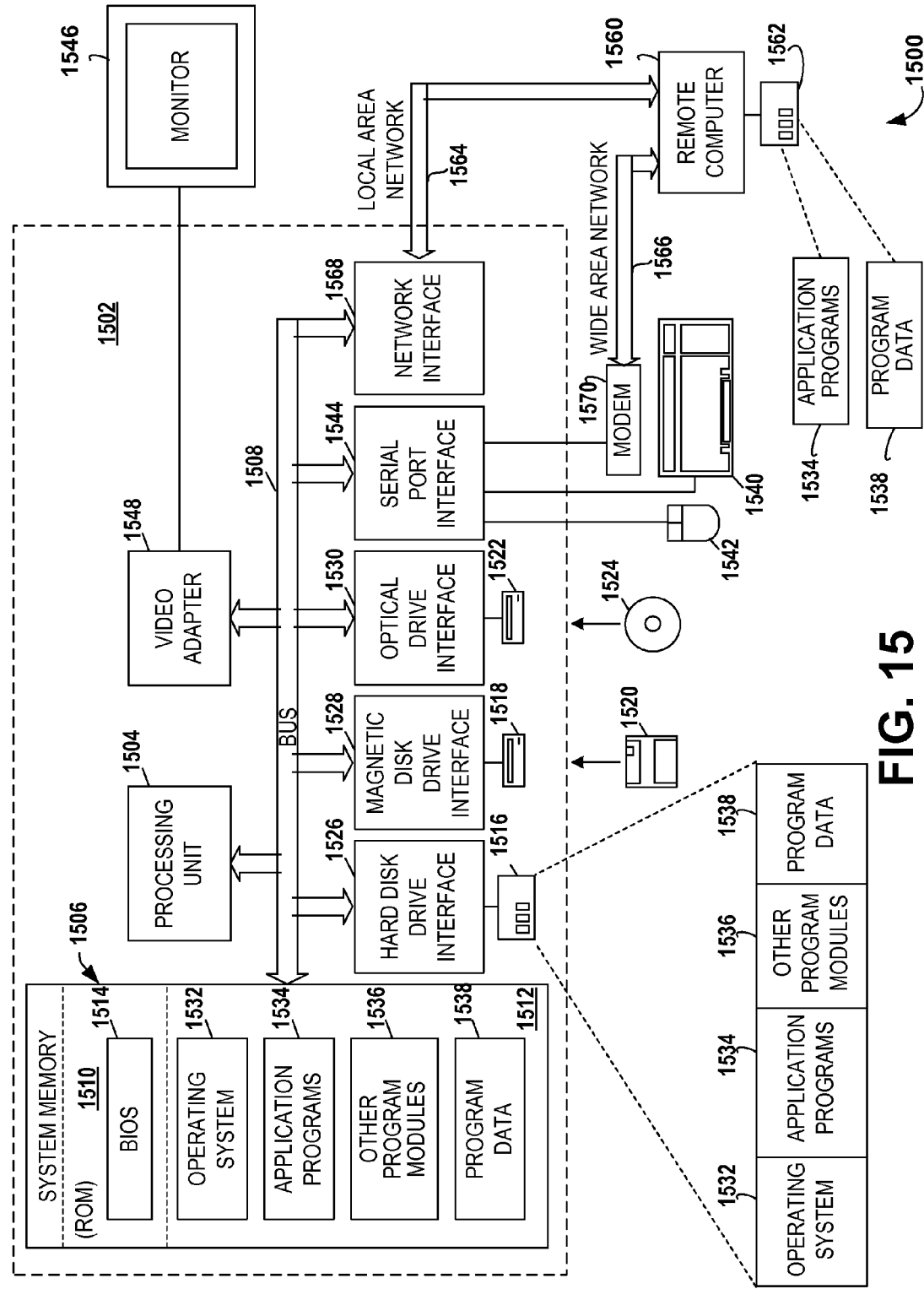
FIG. 15 is an illustration of an exemplary environment in which the novel aspects of the invention can be employed.

In order to provide additional context for various aspects of the invention, FIG. 15 and the following discussion are intended to provide a brief, general description of a suitable computing environment 1510 in which the various aspects of the subject invention can be implemented. While the invention has been described above in the general context of computer-executable instructions that may run on one or more computers, those skilled in the art will recognize that the invention also may be implemented in combination with other program modules and/or as a combination of hardware and software. Generally, program modules include routines, programs, components, data structures, etc. that perform particular tasks or implement particular abstract data types. Moreover, those skilled in the art will appreciate that the inventive methods may be practiced with other computer system configurations, including single-processor or multi-processor computer systems, minicomputers, mainframe computers, as well as personal computers, hand-held computing devices, microprocessor-based or programmable consumer electronics, and the like, each of which may be operatively coupled to one or more associated devices. The illustrated aspects of the invention may also be practiced in distributed computing environments where certain tasks are performed by remote processing devices that are linked through a communications network. In a distributed computing environment, program modules may be located in both local and remote memory storage devices.

With reference to FIG. 15, an exemplary system environment 1500 for implementing the various aspects of the invention includes a conventional computer 1502, including a processing unit 1504, a system memory 1506, and a system bus 1508 that couples various system components, including the system memory, to the processing unit 1504. The processing unit 1504 may be any commercially available or proprietary processor. In addition, the processing unit may be implemented as multi-processor formed of more than one processor, such as may be connected in parallel. The system bus 1508 may be any of several types of bus structure including a memory bus or memory controller, a peripheral bus, and a local bus using any of a variety of conventional bus architectures such as PCI, VESA, Microchannel, ISA, and EISA, to name a few. The system memory 1506 includes read only memory (ROM) 1510 and random access memory (RAM) 1512. A basic input/output system (BIOS) 1514, containing the basic routines that help to transfer information between elements within the computer 1502, such as during start-up, is stored in ROM 1510.

The computer 1502 also may include, for example, a hard disk drive 1516, a magnetic disk drive 1518, e.g., to read from or write to a removable disk 1520, and an optical disk drive 1522, e.g., for reading from or writing to a CD-ROM disk 1524 or other optical media. The hard disk drive 1516, magnetic disk drive 1518, and optical disk drive 1522 are connected to the system bus 1508 by a hard disk drive interface 1526, a magnetic disk drive interface 1528, and an optical drive interface 1530, respectively. The drives 1516-1522 and their associated computer-readable media provide nonvolatile storage of data, data structures, computer-executable instructions, etc. for the computer 1502. Although the description of computer-readable media above refers to a hard disk, a removable magnetic disk and a CD, it should be appreciated by those skilled in the art that other types of media which are readable by a computer, such as magnetic cassettes, flash memory cards, digital video disks, Bernoulli cartridges, and the like, can also be used in the exemplary operating environment 1500, and further that any such media may contain computer-executable instructions for performing the methods of the subject invention.

A number of program modules may be stored in the drives 1516-1522 and RAM 1512, including an operating system 1532, one or more application programs 1534, other program modules 1536, and program data 1538. The operating system 1532 may be any suitable operating system or combination of operating systems. By way of example, the application programs 1534 and program modules 1536 can include inferring a location of a device in accordance with an aspect of the subject invention. A user can enter commands and information into the computer 1502 through one or more user input devices, such as a keyboard 1540 and a pointing device (e.g., a mouse 1542). Other input devices (not shown) may include a microphone, a joystick, a game pad, a satellite dish, wireless remote, a scanner, or the like. These and other input devices are often connected to the processing unit 1504 through a serial port interface 1544 that is coupled to the system bus 1508, but may be connected by other interfaces, such as a parallel port, a game port or a universal serial bus (USB). A monitor 1546 or other type of display device is also connected to the system bus 1508 via an interface, such as a video adapter 1548. In addition to the monitor 1546, the computer 1502 may include other peripheral output devices (not shown), such as speakers, printers, etc.

It is to be appreciated that the computer 1502 can operate in a networked environment using logical connections to one or more remote computers 1560. The remote computer 1560 may be a workstation, a server computer, a router, a peer device or other common network node, and typically includes many or all of the elements described relative to the computer 1502, although, for purposes of brevity, only a memory storage device 1562 is illustrated in FIG. 15. The logical connections depicted in FIG. 15 can include a local area network (LAN) 1564 and a wide area network (WAN) 1566. Such networking environments are commonplace in offices, enterprise-wide computer networks, intranets and the Internet.

When used in a LAN networking environment, for example, the computer 1502 is connected to the local network 1564 through a network interface or adapter 1568. When used in a WAN networking environment, the computer 1502 typically includes a modem (e.g., telephone, DSL, cable, etc.) 1570, or is connected to a communications server on the LAN, or has other means for establishing communications over the WAN 1566, such as the Internet. The modem 1570, which can be internal or external relative to the computer 1502, is connected to the system bus 1508 via the serial port interface 1544. In a networked environment, program modules (including application programs 1534) and/or program data 1538 can be stored in the remote memory storage device 1562. It will be appreciated that the network connections shown are exemplary and other means (e.g., wired or wireless) of establishing a communications link between the computers 1502 and 1560 can be used when carrying out an aspect of the subject invention.

In accordance with the practices of persons skilled in the art of computer programming, the subject invention has been described with reference to acts and symbolic representations of operations that are performed by a computer, such as the computer 1502 or remote computer 1560, unless otherwise indicated. Such acts and operations are sometimes referred to as being computer-executed. It will be appreciated that the acts and symbolically represented operations include the manipulation by the processing unit 1504 of electrical signals representing data bits which causes a resulting transformation or reduction of the electrical signal representation, and the maintenance of data bits at memory locations in the memory system (including the system memory 1506, hard drive 1516, floppy disks 1520, CD-ROM 1524, and remote memory 1562) to thereby reconfigure or otherwise alter the computer system's operation, as well as other processing of signals. The memory locations where such data bits are maintained are physical locations that have particular electrical, magnetic, or optical properties corresponding to the data bits.

What has been described above is one or more aspects of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications and variations that fall within the spirit and scope of the appended claims. In addition, while a particular feature of the invention may have been disclosed with respect to only one of several implementations, such feature may be combined with one or more other features of the other implementations as may be desired and advantageous for any given or particular application. Furthermore, to the extent that the term "includes" is used in either the detailed description or the claims, such term is intended to be inclusive in a manner similar to the term "comprising."

What is claimed is:

1. A method of making a memory device with a selection element and a control line in a layer of the memory device, comprising:
   forming a first layer with a first control line;
   forming a memory element coupled to the first control line;
   forming a metal via coupled to the memory element;
   forming a second layer with a selection element coupled the metal via; and
   forming a wordline in the second layer, the wordline coupled to the selection element.

2. The method of claim 1, the selection element is a diode.

3. The method of claim 2, the diode comprises a p-n junction diode.

4. The method of claim 2, the diode is a Schottky diode.

5. The method of claim 2, the diode is a zener diode.

6. The method of claim 1, the first control line is a wordline.

7. The method of claim 1, the first control line is a bitline.

8. The method of claim 1, the selection element possesses switching characteristics to write, read and erase the memory device.

9. The method of claim 1, the selection element abuts the wordline.

10. A method of making a memory device with a selection diode in the same layer as a wordline comprising:
    forming a first layer comprising a bitline;
    depositing a first interlayer dielectric stack upon the first layer;
    forming a via opening in the first dielectric stack;
    forming a memory element at the bottom of the via opening, the memory element coupled to the bitline;
    filling the via opening with a conductor;
    polishing the conductor to form a via plug;
    depositing a second dielectric stack;
    masking, exposing, and etching a first region of the second dielectric stack;
    depositing a semiconductor in the first region of the second dielectric stack;
    masking and implanting a p-doped portion of the semiconductor;
    masking and implanting an n-doped portion of the semiconductor, the n-dope portion abutting the p-doped portion;
    annealing the p-doped and n-doped portions of the semiconductor;
    masking, exposing and etching a second region of the second dielectric stack, the second region abutting the p-doped portion of the semiconductor;
    depositing a barrier metal and copper in the second region to form a wordline; and
    polishing the wordline.

11. The method of claim 10, the n-doped portion and p-doped portion of the semiconductor forms a p-n junction diode.

12. The method of claim 10, the n-doped portion and p-doped portion of the semiconductor forms a zener diode.

13. The method of claim 10, the n-doped portion and p-doped portion of the semiconductor forms a Schottky diode.

14. The method of claim 10, the semiconductor is one of Germanium, Silicon and a III-V compound.

15. The method of claim 10, the conductor is one of Cu, W, Al, Ti and Ta.

16. The method of claim 10, the selection diode abuts the word line.

17. The method of claim 10, the p-doped region of the selection diode abuts the wordline.

18. The method of claim 10, the selection diode possesses switching characteristics to write, read and erase the memory element.

19. The method of claim 10, further coupling the bitline to a voltage source.

20. The method of claim 10, further coupling the wordline to a voltage source.

* * * * *